(12) United States Patent
Langhammer et al.

(10) Patent No.: US 11,016,733 B2
(45) Date of Patent: May 25, 2021

(54) CONTINUOUS CARRY-CHAIN PACKING

(71) Applicant: Intel Corporation, Santa Clara, CA (US)

(72) Inventors: Martin Langhammer, High Wycombe (GB); Sergey Vladimirovich Gribok, Santa Clara, CA (US); Gregg William Baeckler, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 16/145,151

(22) Filed: Sep. 27, 2018

(65) Prior Publication Data
US 2019/0042200 A1 Feb. 7, 2019

(51) Int. Cl.
| | | |
|---|---|---|
| *G06F 7/575* | (2006.01) | |
| *H03K 19/20* | (2006.01) | |
| *H03K 19/17728* | (2020.01) | |
| *G06F 7/509* | (2006.01) | |
| *G06F 7/503* | (2006.01) | |

(52) U.S. Cl.
CPC .............. *G06F 7/575* (2013.01); *G06F 7/503* (2013.01); *G06F 7/509* (2013.01); *H03K 19/17728* (2013.01); *H03K 19/20* (2013.01)

(58) Field of Classification Search
CPC ... G06F 7/503; G06F 7/509; H03K 19/17728; H03K 19/20
USPC .......................................... 708/714, 230–236
See application file for complete search history.

(56) References Cited

U.S. PATENT DOCUMENTS

| | | | | |
|---|---|---|---|---|
| 4,707,800 A | * | 11/1987 | Montrone | G06F 7/506 708/518 |
| 5,327,369 A | * | 7/1994 | Ashkenazi | G06F 7/507 708/274 |
| 5,481,486 A | * | 1/1996 | Cliff | G06F 1/0356 708/235 |
| 2016/0246571 A1 | * | 8/2016 | Walters | G06F 7/575 |
| 2017/0103299 A1 | * | 4/2017 | Aydonat | G06N 3/04 |

OTHER PUBLICATIONS

Hauck et al, High-Performance Carry Chains for FPGAs, 1998, FPGA 98 Monterey CA USA ,pp. 223-233. (Year: 1998).*
Haroldsen [thesis], Academic Packing for Commercial FPGA Architectures, Jul. 1, 2017. (Year: 2017).*
U.S. Appl. No. 15/937,347, filed Mar. 27, 2018, Martin Langhammer.

* cited by examiner

*Primary Examiner* — Tan V Mai
(74) *Attorney, Agent, or Firm* — Fletcher Yoder, P.C.

(57) ABSTRACT

The present disclosure relates generally to techniques for enhancing packing density of carry-chains implemented on an integrated circuit. In particular, a packed-carry chain may be implemented to redistribute and/or emulate the logic of a first number of arithmetic logic cells of a first and/or second carry-chain using a second number of arithmetic logic cells less than or equal to the first number. By fitting the first and second carry-chain into such a packed carry-chain, the area consumed to perform the arithmetic operations of the first and second carry-chain may be reduced. As a result, the integrated circuit may benefit from increased efficiencies, reduced latency, and reduced resource consumption (e.g., wiring, area, and power).

20 Claims, 12 Drawing Sheets

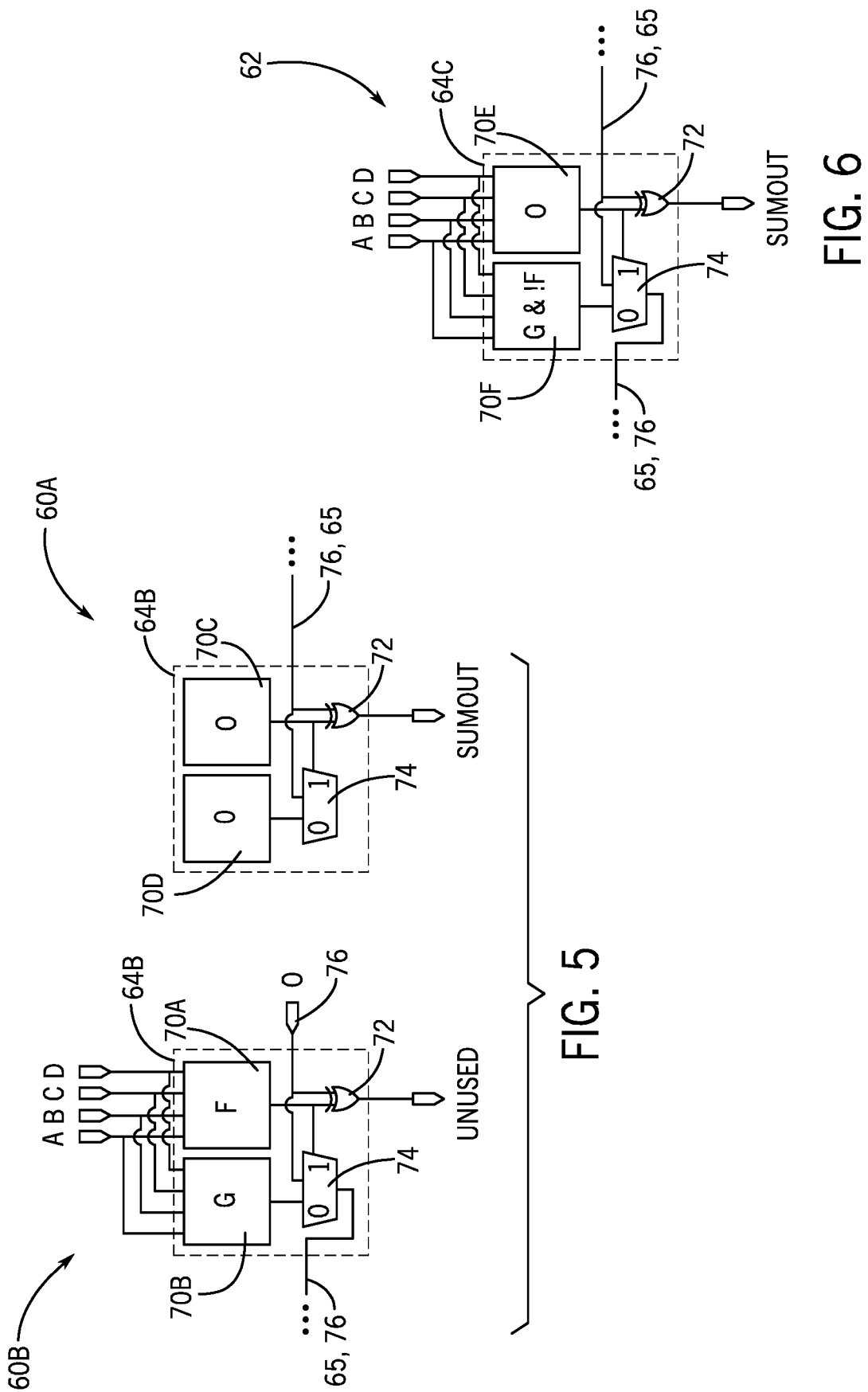

US 11,016,733 B2

CONTINUOUS CARRY-CHAIN PACKING

BACKGROUND

The present disclosure relates generally to integrated circuits, such as field programmable gate arrays (FPGAs). More particularly, the present disclosure relates to packing a set of independent carry-chains together on an integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Machine learning is becoming increasingly valuable in a number of technical fields. For example, machine learning may be used in artificial intelligence (AI), natural language processing, computer vision, such as object recognition, bioinformatics, and economics, among other fields and applications. Further, much of the computation involved in machine learning is based on inference, which may use small arithmetic structures, such as carry-chains. Accordingly, to accommodate growth and improvement of machine learning implementations and applications, the number of arithmetic structures in an integrated circuit may increase. However, packing the individual arithmetic structures onto the integrated circuit may consume significant area, power, and routing resources of the integrated circuit.

BRIEF DESCRIPTION OF THE DRAWINGS

Various aspects of this disclosure may be better understood upon reading the following detailed description and upon reference to the drawings in which:

FIG. 5 is a block diagram of a most significant logic cell of the first carry-chain and a least significant logic cell of the second carry-chain, in accordance with an embodiment;

FIG. 6 is a block diagram of a logic cell implemented to emulate the operations of the most and least significant logic cells of FIG. 5, in accordance with an embodiment;

DETAILED DESCRIPTION OF SPECIFIC EMBODIMENTS

Figure 1:
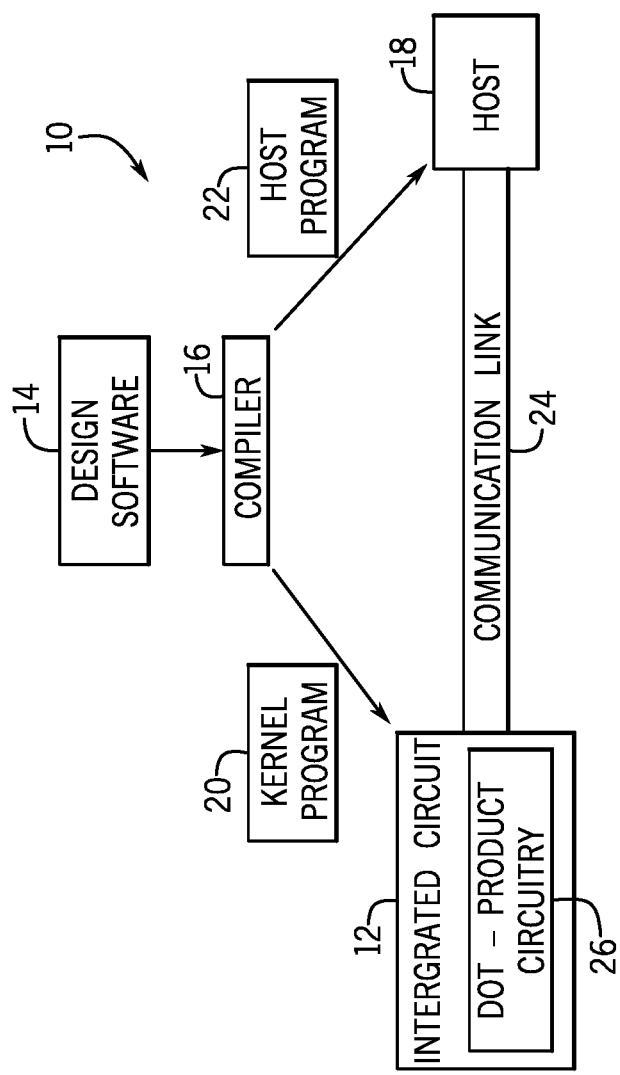
FIG. 1 is a block diagram of a system for implementing dot-product circuitry, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to increasing the density of carry-chains implemented on an integrated circuit. More specifically, the present disclosure relates to more efficient packing of a set of independent carry-chains in programmable logic. In some embodiments, the integrated circuit device may be implemented with a number (e.g., 10, 20, 30 and/or the like) of arithmetic logic cells (e.g., arithmetic circuitry) organized and/or arranged into groups, such as logic array blocks (LAB), to implement logic functions. By using a logic array block having a certain number (N) of arithmetic cells, the integrated circuit device may include certain natural logic boundaries, which may dictate the packing of logic elements, such as a carry-chain, onto the integrated circuit device. For example, a design for a carry-chain that uses N arithmetic cells may snap naturally into a single logic array block. However, if the design for the carry-chain uses fewer than N arithmetic logic cells, the remaining arithmetic logic cells in the logic array block may remain unused. As such, the resources (e.g., logic resources) of the integrated circuit device may be underutilized, which may result in an unnecessary consumption of area on the integrated circuit device.

In some embodiments, such as artificial intelligence inference, the integrated circuit may include a number of small (e.g., 5-15 bit) arithmetic structures, such as carry-chains, that may underutilize the resources (e.g., logic resources and/or area) of the integrated circuit device. For example, to compute a dot-product, a number of carry-chains may sum a set of products. Designs for the carry-chains may fit into fewer than the N arithmetic logic cells of a logic array block, leaving unused arithmetic logic cells. Accordingly, to more efficiently implement (e.g., using reduced area and/or resources) these carry-chains on the integrated circuit, a subset of the carry-chains may be packed together in a single, packed carry-chain. For example, the packed carry-chain may include a first carry-chain and a second carry-chain, which may be independent from the first carry-chain. To reduce the effect of a carry-out signal and/or noise produced by the first carry-chain on the second carry-chain (e.g., on the carry-in signal to the second carry-chain), the packed carry-chain may include dummy logic (e.g., a dummy arithmetic logic cell) between the first carry-chain and the second carry-chain. However, in embodiments where the carry-out signal of the first carry-chain is known to be zero (e.g., logical low), the packed carry-chain may be implemented without dummy logic between the first and second carry-chain. Accordingly, the area consumed by the packed carry-chain in such embodiments may be reduced. Further, in some embodiments, each of the first carry-chain and the second carry-chain may include unused logic and/or circuitry. Thus, by consolidating logic and/or circuitry of the first carry-chain with the second carry-chain in the packed carry-chain, the area of the packed carry-chain may be reduced further, and an integrated circuit may support a greater number of carry-chains and/or additional arithmetic structures.

To further reduce the area involved with implementing and/or packing carry-chains in programmable logic, the packed-carry chain may be implemented to redistribute and/or emulate the logic of a first number of arithmetic logic cells of the first and second carry-chain using a second number of arithmetic logic cells less than or equal to the first number. For example, in some embodiments, the logic of the most significant arithmetic logic cell of the first carry-chain may be combined with the logic of the least significant arithmetic logic cell of the second carry-chain in a single arithmetic logic cell of the packed carry-chain. Moreover, in some embodiments, based in part on the structure of the arithmetic logic cells, the logic of the two most significant arithmetic logic cell of the first carry-chain may be combined with the logic of the two least significant arithmetic logic cell of the second carry-chain in a pair of arithmetic logic cells of the packed carry-chain. Further, in some embodiments, such as in the case of packing a pair of carry-chains in an adder tree implemented to perform signed addition, the inputs to the first and second carry-chain may be redistributed in the packed carry-chain to reduce the area consumed by the packed carry-chain. Additionally, any suitable combination of the techniques described above may be implemented to reduce the area consumed by a packed carry-chain, as will be discussed in further detail below.

With the foregoing in mind, FIG. 1 illustrates a block diagram of a system 10 that may implement efficient carry-chain packing techniques. A designer may desire to implement functionality involving a number of carry-chains, such as a dot-product function, on an integrated circuit device 12 (IC, such as a field programmable gate array (FPGA)). The designer may specify a high-level program to be implemented, such as an OpenCL program, which may enable the designer to more efficiently and easily provide programming instructions to configure a set of programmable logic cells for the integrated circuit device 12 without requiring specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the IC.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of dot-product circuitry 26 on the integrated circuit device 12. The dot-product circuitry 26 may include circuitry and/or other logic elements and may be configured to implement, for example, dot-product and/or machine learning operations. Accordingly, in some embodiments, the dot-product circuitry 26 may be implemented to include and/or operatively couple to a number of carry-chains.

Figure 2:
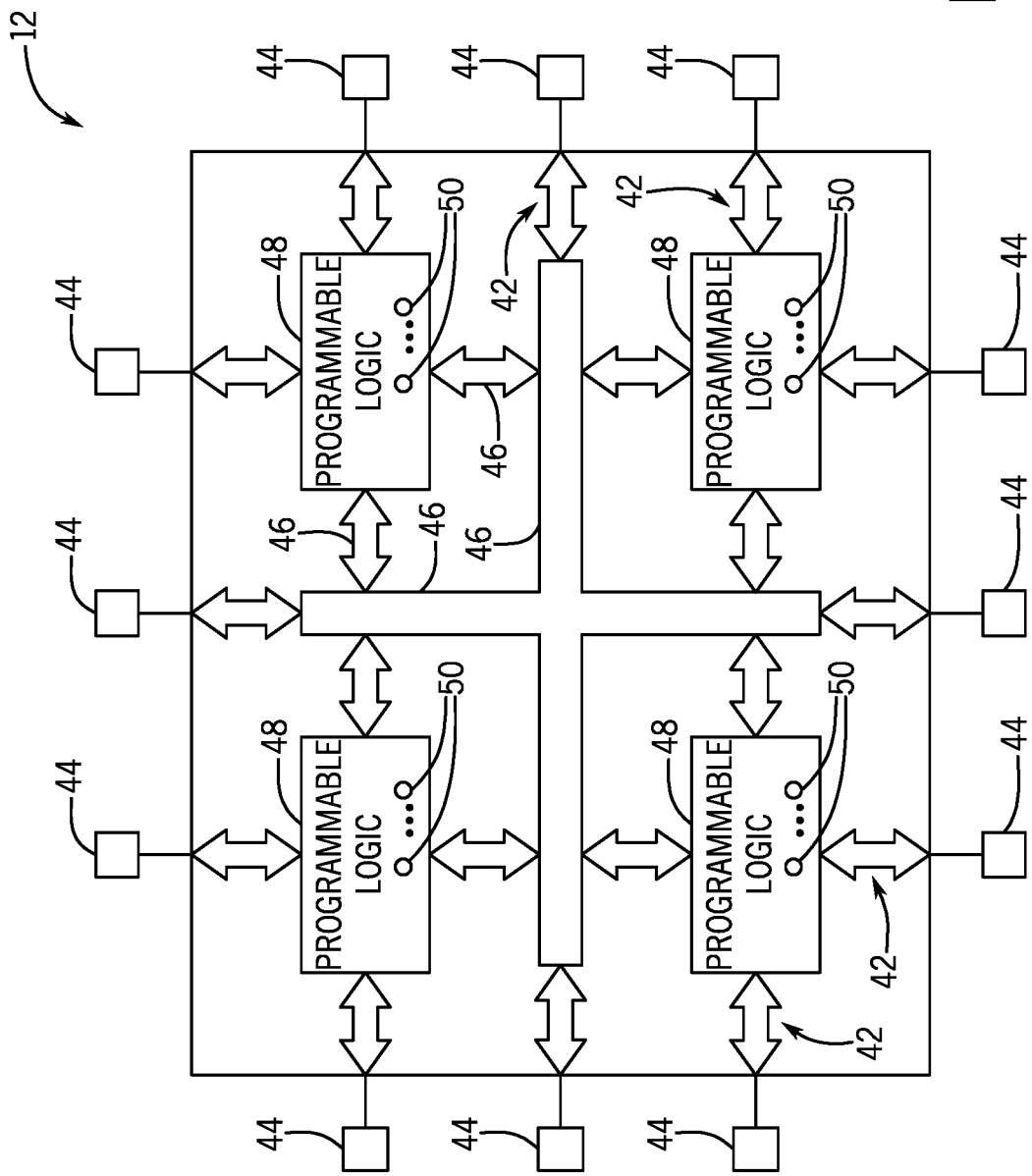
FIG. 2 is a block diagram of an integrated circuit where dot-product circuitry may be implemented, in accordance with an embodiment.

Turning now to a more detailed discussion of the integrated circuit device 12, FIG. 2 illustrates an integrated circuit device 12, which may be a programmable logic device, such as a field programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

In some embodiments, the integrated circuit device 12 may be implemented with a number (e.g., 10, 20, 30 and/or the like) of arithmetic logic cells (e.g., arithmetic circuitry) organized and/or arranged into groups, such as logic array blocks (LAB). The logic array blocks may be used to implement logic functions, such as arithmetic and/or combinatorial operations. Accordingly, in some embodiments, the design software 14 and/or the compiler 16 may map a design for a particular functionality and/or logic element, such as a carry-chain, to a logic array block. By using a logic array block having a certain number (N) of arithmetic cells, the integrated circuit device 12 may include certain natural logic boundaries, which may dictate the mapping and/or packing of logic elements, such as a carry-chain, onto the integrated circuit device. For example, the design for a carry-chain that uses N arithmetic cells may snap naturally into a single logic array block. However, if the design for the carry-chain uses fewer than N arithmetic logic cells, the remaining arithmetic logic cells in the logic array block may remain unused. As such, the resources (e.g., logic resources) of the integrated circuit device 12 may be underutilized, which may result in an unnecessary consumption of area on the integrated circuit device 12.

Further, in some embodiments, such as artificial intelligence inference, the integrated circuit device 12 may include a number of small (e.g., 5-15 bit) arithmetic structures, such as carry-chains. As discussed above, designs for these carry-chains may underutilize the resources (e.g., logic resources and/or area) of the integrated circuit device 12. For example, to compute a dot-product (e.g., to implement dot-product circuitry 26), a number of carry-chains may sum a set of products. Designs for the carry-chains may fit into fewer than the N arithmetic logic cells of a logic array block, leaving unused arithmetic logic cells. Accordingly, as described in greater detail below, to more efficiently implement (e.g., using reduced area and/or resources) these carry-chains on the integrated circuit device 12, the design software 14 and/or the compiler 16 may map a subset of the carry-chains to be packed together in a single, packed carry-chain that may fit to the resources of the integrated circuit device 12 better than the individual mappings of the subset of carry-chains to the integrated circuit device 12. As such, the packed carry-chain may increase the resource utilization in the integrated circuit device 12.

Figure 3:
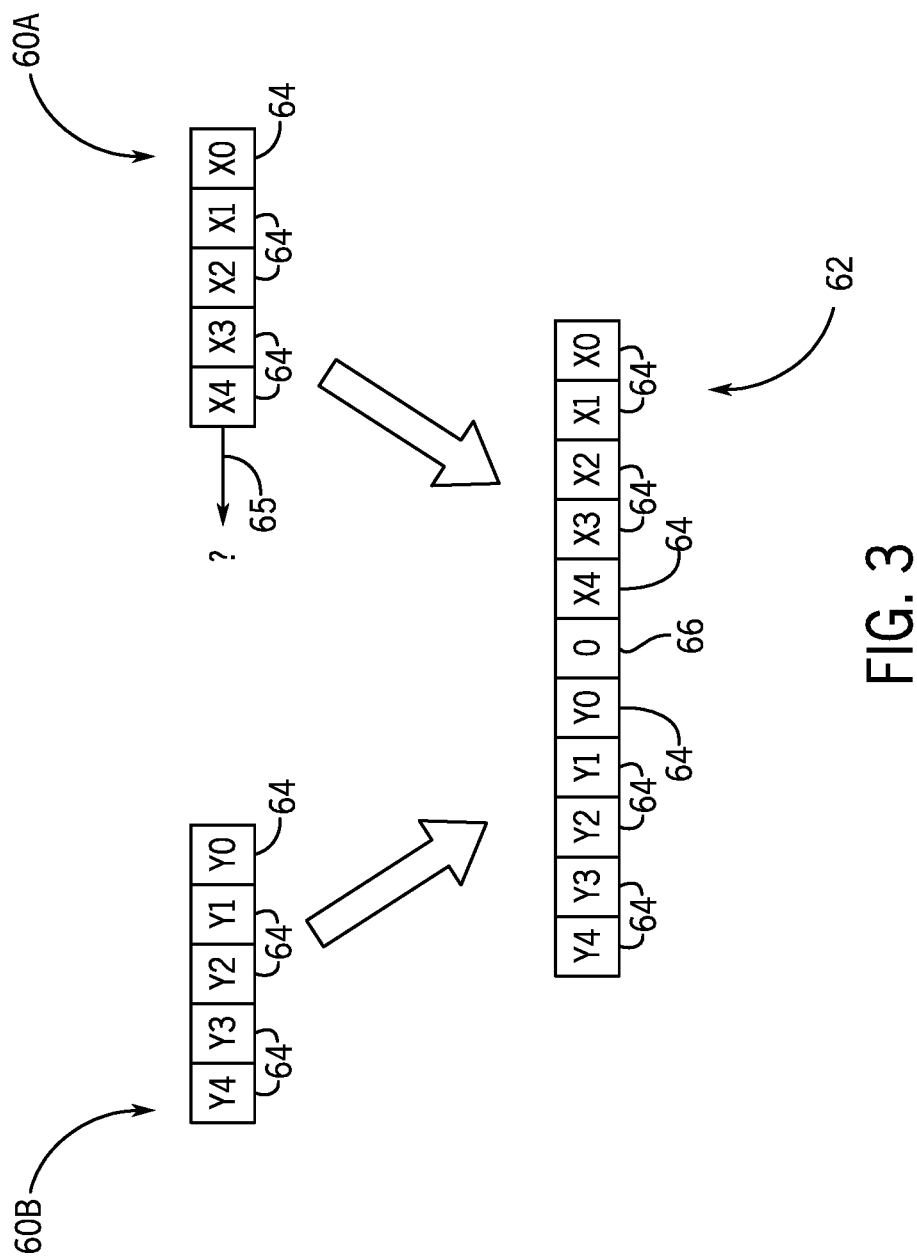
FIG. 3 is a block diagram of a first and second carry-chain packed together in a packed carry-chain and separated by a dummy arithmetic cell, in accordance with an embodiment.

To fit arithmetic structures, such as combinatorial circuitry and/or logic, onto the integrated circuit device 12, independent arithmetic structures may be packed together. For example, a first carry-chain 60A (e.g., carry-chain circuitry) may be packed together with a second carry-chain 60B into a single, packed carry-chain 62 (e.g., paced carry-chain circuitry), as illustrated in FIG. 3. The first carry-chain 60A may implement a first set of chained arithmetic operations (e.g., X4, X3, X2, X1, and X0), which are independent from a second set of chained arithmetic operations (e.g., Y4, Y3, Y2, Y1, and Y0) implemented by the second carry-chain 60B. More specifically, in some embodiments, the each of the first carry-chain 60A may include a set of logic cells 64 (e.g., an arithmetic logic cell) implemented to determine the respective set of chained arithmetic operations (e.g., the first set and the second set, respectively). In some embodiments, each of the arithmetic operations (e.g., X4, X3, X2, X1, X0, Y4, Y3, Y2, Y1, and Y0) may represent an addition operation (e.g., a binary addition operation, a ternary addition operation, and/or the like). Accordingly, as described in greater detail below, each logic cell 64 may represent an adder structure (e.g., a full adder structure, a half adder structure, and/or the like) implemented to receive a number of input values.

Further, because a carry-out signal 65 (e.g., value) of the first carry-chain 60A may not be known (e.g., at carry-out circuitry), the packed carry-chain 62 may include a dummy arithmetic cell 66. More specifically, to prevent or eliminate noise, which may result from the carry-out signal 65, from affecting the operation of the second carry-chain 60B in the packed carry-chain 62, a dummy arithmetic cell 66 may be packed between the first carry-chain 60A and the second carry-chain 60B. In some embodiments, the dummy arithmetic cell 66 may be implemented as a full adder structure (e.g., cell) having each of its inputs connected to zero.

Figure 4:
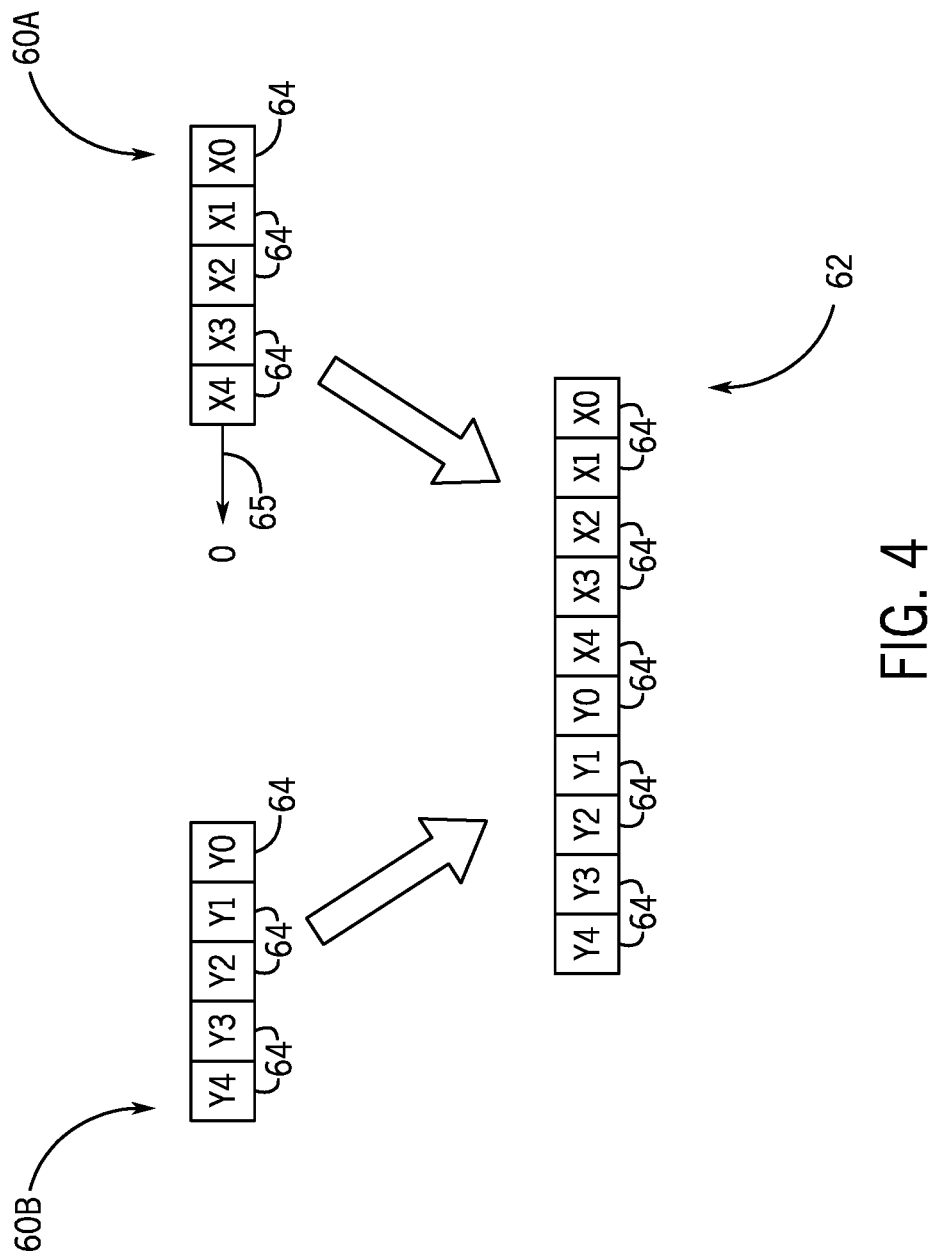
FIG. 4 is a block diagram of the first and second carry-chain packed together in a packed carry-chain without the use of the dummy arithmetic cell, in accordance with an embodiment.

On the other hand, if the carry-out signal 65 of the first carry-chain 60A is known to be zero (e.g., logical low), the packed carry-chain 62 may be implemented without a dummy arithmetic cell 66, as illustrated in FIG. 4. For instance, in some embodiments, the carry-out signal 65 of the first carry-adder chain 60 may be determined before the first carry-chain 60A performs an operation, such as during the design and/or layout of the first carry-chain on the integrated circuit device 12. By removing the dummy arithmetic cell 66 from the packed carry-chain 62, the packed carry-chain 62 may occupy less area on the integrated circuit device 12, which may provide increased flexibility for the design and layout of the integrated circuit device 12.

Moreover, in some embodiments, the size of the packed carry-chain 62 may be further reduced by emulating and/or combining the logic of two or more logic cells 64 in a single logic cell 64. For example, in certain embodiments, the most significant (MS) logic cell 64A of the first-carry chain 60A and the least significant (LS) logic cell 64B of the second carry-chain 60B may be packed into a single logic cell 64. More specifically, the first carry-chain 60A and the second carry-chain 60B may be joined by the single logic cell 64 in a single, packed carry-chain. Accordingly, the resulting packed carry-chain may include one fewer logic cell 64 than the sum of the logic cells 64 of the first carry-chain 60A and the second carry-chain 60B, as described in greater detail below.

As an illustrative example, FIG. 5 includes an embodiment of a most significant logic cell 64A of the first carry-chain 60A and a least significant logic cell 64B of the second carry-chain 60B suitable to be packed together in a single logic cell 64. In some embodiments, each of the most significant logic cell 64A and the least significant logic cell 64B, as well as the remaining logic cells 64 of the first carry-chain 60A and the second carry-chain 60B, may include a respective set of look up tables (LUTs) 70, which may be implemented to determine the result of a combinatorial function on one or more inputs. Accordingly, to implement an adder structure in a carry-chain 60, the LUTs 70 in a logic cell 64 may determine the sum and/or carry out resulting from a combination of the inputs to the logic cell 64.

For example, in the illustrated embodiment, the least significant logic cell 64B includes a LUT 70A implemented to determine the result of a combinatorial function denoted as 'F' using the inputs to the least significant logic cell 64B (e.g., A, B, C, D). Further, the least significant logic cell 64B includes a LUT 70B implemented to determine the result of a combinatorial function denoted as 'G' using the same inputs (e.g., A, B, C, D). For simplicity, these combinatorial functions are denoted by 'F' and 'G' in the illustrated embodiment. However, 'F' may represent a function to determine the sum of the inputs to the most significant logic cell 64A, such as A XOR B AND C XOR D, where XOR represents the exclusive OR function and AND represents the logical AND function. In such embodiments, 'G' may represent a function to determine the carry of the inputs, such as (AB+CD)>3. In other embodiments, 'F' and/or 'G' may represent functions to determine a generate and/or a propagate resulting from the inputs to the least significant logic cell 64B. Moreover, it should be appreciated that the LUTs 70 of a logic cell 64 may perform any suitable function on the inputs to the logic cell 64 and that the combinatorial functions may vary between LUTs 70 within a logic cell 64 and/or across different logic cells 64.

As further illustrated, a logic cell 64 of a carry-chain 60 may include an exclusive OR (XOR) gate 72 and a multiplexor (mux) 74. The XOR gate 72 may receive an output from a LUT 70 and a carry-in signal 76 (e.g., via carry-in circuitry) as inputs. As illustrated, the carry-in signal 76 may be produced from a previous logic cell 64 in the carry-chain 60 (not shown) or may be implemented to carry into the carry-chain 60 (e.g., into the least significant logic cell 64). Further, the XOR gate 72 may be implemented to produce a sum out signal (e.g., SUMOUT), which may be output by logic cell 64. However, in certain embodiments, such as the illustrated least significant logic cell 64B of the second carry-chain 60B, the sum out signal (e.g., output circuitry) remains unused (denoted as "Unused"). For instance, while the sum out signal may be used in some embodiments to provide additional adder functionality, in the second stage of a two-stage multiplier design, among other embodiments, the sum out signal is not used.

The mux 74 may select between a value resulting from a first LUT 70 (e.g., 70B) of the logic cell 64 and a carry-in value based in part on the value resulting from a second LUT 70 (e.g., 70A) of the logic cell 64. For example, in some embodiments, the value resulting from the second LUT 70 may be routed to the mux 74 as a select signal. For instance, in the illustrated embodiment, if the result of the combinatorial function 'F' determined by the LUT 70A is zero (e.g., logical low), the mux 74 may output the result of the combinatorial function 'G' (e.g., the result determined by LUT 70B). If, on the other hand, the result of the combinatorial function 'F' determined by the LUT 70A is one (e.g., logical high), the mux 74 may output the carry-in signal 76 (e.g., zero). The output of the mux 74 may be routed as a carry-out signal 65 of the logic cells 64, as depicted by the illustrated least significant logic cell 64B. In other embodiments, the output of the mux 74 (e.g., carry-out circuitry) may remain unused. For instance, because the most significant logic cell 64A does not chain (e.g., carry into) to a subsequent logic cell 64, the output of the mux 74 may be ignored. In some embodiments, for example, the carry-out signal 65 is not determined by the logic cell 64.

Moreover, it may be appreciated that any suitable adder structure and/or arithmetic operations may be performed by each of the logic cells 64 of a carry-chain 60. Accordingly, a carry-chain may include additional or fewer structures (e.g., circuitry and/or logic). Further, while the techniques are described with reference to specific logic functions and/or select signal values, in other embodiments, inverse logic may be utilized. Thus, examples described herein are intended to be illustrative, and not limiting.

As discussed above, the sum out signal of the illustrated least significant logic cell 64B (e.g., the output of the XOR gate 72) remains unused, which may occur in the second stage of a two-stage multiplier design, for example. Further, while the illustrated least significant logic cell 64B of the second carry-chain 60B is implemented to receive four independent inputs (e.g., A, B, C, and D) and to compute one or more combinatorial functions (e.g., 'F' and/or 'G') using these inputs, the most significant logic cell 64A of the first carry-chain 60A may be implemented with a set of LUTS 70 (e.g., 70C and 70D) implemented to output a constant zero (e.g., logical low), regardless of the inputs to the most significant logic cell 64A, if any. Accordingly, each of the illustrated most significant logic cell 64A and the least significant logic cell 64B include unused logic and/or circuitry, such as the LUTs 70 (e.g., 70C and 70D) and the sum out signal (e.g., output circuitry for the sum out signal), respectively.

As such, when packing the first carry-chain 60A and the second carry-chain 60B together, the circuitry and/or logic of the most significant logic cell 64A of the first carry-chain 60A and of the least significant logic cell 64B of the second carry-chain 60B may be consolidated into a single logic cell 64C, as illustrated in FIG. 6. The logic cell 64C may include a set of LUTs 70 (e.g., 70E and 70F), an XOR gate 72, and a mux 74, as described above with reference to the most significant logic cell 64A and the least significant logic cell 64B. Accordingly, in some embodiments, the logic cell 64C may consume the same area and/or resources (e.g., wiring, circuitry, and/or logic) as either or both of the logic cell 64A or 64B. As illustrated, each of the LUTs 70 (e.g., 70E and 70F) may receive the inputs (e.g., A, B, C, D) routed to the least significant logic cell 64B in FIG. 5. In some embodiments, a first LUT 70E of the logic cell 64C may be implemented to output a constant zero, regardless of the inputs to the logic cell 64C. Accordingly, because the output of the first LUT 70E may be routed as a first input to the XOR gate 72, the output of the XOR gate 72 (e.g., the sum out signal) may represent the value of a second input to the XOR gate 72. More specifically, to generate the sum out signal (e.g., SUMOUT) that would have resulted from the most significant logic cell 64A of FIG. 5, the carry-out signal 65 from the logic cell 64 (not shown) chaining into the logic cell 64C may be routed as the second input to the XOR gate 72 and may be produced as the output of the XOR gate 72. Further, the output of the first LUT 70E may be routed as the select signal of the mux 74. As such, for a set of inputs to the mux 74, the input corresponding to a select signal of zero (e.g., logical low) may be output by the mux 74. Thus, as illustrated, by routing the output of the second LUT 70BF to the output corresponding to the select signal of zero, the output of the second LUT 70F may be output by the mux 74.

The second LUT 70F may determine the result of a combinatorial function (e.g., G & !F) using the inputs (e.g., A, B, C, D) to the logic cell 64C. More specifically, the second LUT 70B may produce the result output by the mux 74 of the least significant logic cell 64B of FIG. 5 such that the carry-out signal 65 of the logic cell 64C is the same as the carry-out signal 65 of the least significant logic cell 64B. For instance, by taking the logical AND of the combinatorial function 'G' and the complement of the combinatorial function 'F' the second LUT 70B may determine the result selected by a mux 74 implemented to select between the result of the combinatorial function 'G' and zero based on the result of the combinatorial function 'F'. More specifically, in both the least significant logic cell 64B and the logic cell 64C, if the result of the combinatorial function 'F' is one (e.g., a logical high), the mux 74 may output zero (e.g., the carry-in signal 76), and if the result of the combinatorial function 'F' is zero (e.g., a logical low), the mux 74 may output the result of the combinatorial function 'G'.

Accordingly, the XOR gate 72 of the logic cell 64C may output the same sum out signal as the XOR gate 72 of the most significant logic cell 64A of FIG. 5. Further, the mux 74 of the logic cell 64C may output the same carry-out signal 65 as the mux 74 of the most significant logic cell 64A of FIG. 5. As such, the logic and/or circuitry of the most significant logic cell 64A of the first carry-chain 60A and the least significant logic cell 64B of the second carry-chain 60B may be reduced to the logic cell 64C. Further, the logic cell 64 may physically connect, but maintain logical separation between the first and second carry-chains (e.g., 60A and 60B, respectively). To that end, the first carry-chain 60A and the second carry-chain 60B may be joined by the logic cell 64C within the packed carry-chain 62. Thus, the packed carry-chain 62 may include one fewer logic cell 64 than the total number of logic cells in the first carry-chain 60A and the second carry-chain 60B. As a result, the packed carry-chain 62 may fit more readily onto the integrated circuit device 12, creating increased design flexibility and capability. For instance, by packing the first carry-chain 60A and the second carry-chain 60B together using the logic cell 64C, the area consumed by the first carry-chain 60A and the second carry-chain may be reduced. Moreover, the placement and routing of the packed carry-chain 62 onto the integrated circuit device 12 may be implemented more rapidly than at least the placement and routing of the embodiments described with reference to FIGS. 3-4.

Further, in some embodiments, the first carry-chain 60A and the second carry-chain 60B may be packed into a smaller packed carry-chain 62. For instance, the first carry-chain 60A and the second carry-chain 60B may be fit into a packed carry-chain having two fewer logic cells 64 than the total number of logic cells in the first carry-chain 60A and the second carry-chain 60B. More specifically, by using logic cells 64 having a different circuitry and/or routing, such as a shared arithmetic logic cell, four logic cells 64 may be reduced down to two logic cells 64, as described in greater detail below.

Figure 7:
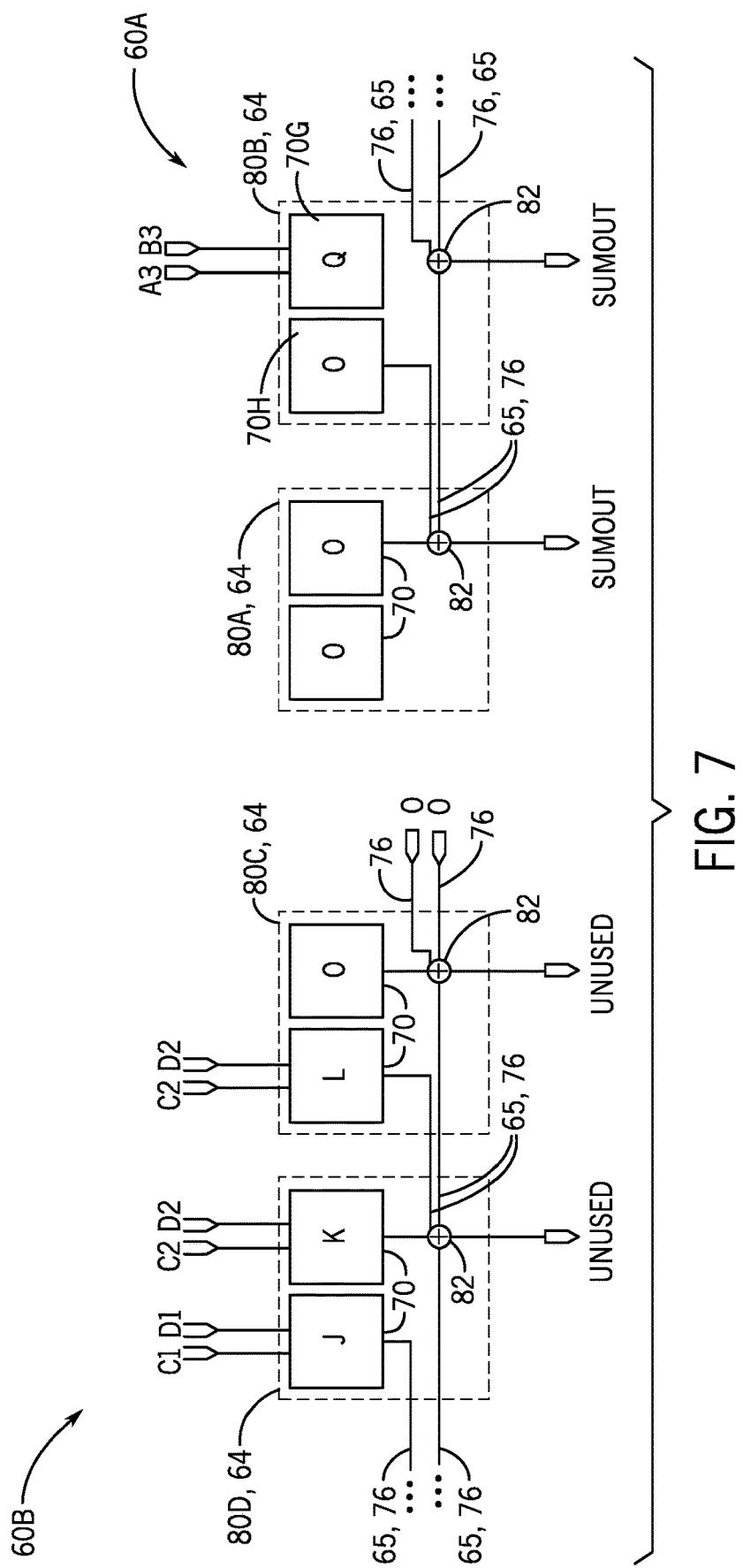
FIG. 7 is a block diagram of the two most significant shared arithmetic logic cells of the first carry-chain and the two least significant shared arithmetic logic cells of the second carry-chain, in accordance with an embodiment.

Turning now to FIG. 7, a portion (e.g., the most significant portion) of the first carry-chain 60A and a portion (e.g., the least significant portion) of the second carry-chain 60B implemented with shared arithmetic logic cells 80 and suitable to be packed down to two shared arithmetic logic cells 80 are illustrated. Each of the shared arithmetic logic cells 80 may include a set of LUTs 70, as well as an adder 82. As described above with reference to FIG. 5, a LUT 70 may be implemented to determine the result of a combinatorial function (e.g., 'J', 'K', 'L', 'Q') on the inputs to the respective shared arithmetic logic cell 80 having the LUT 70 such that the shared arithmetic logic cell 80 may determine the result of an addition operation. More specifically, in some embodiments, the LUT 70 may output a sum and/or a carry, a generate signal and/or a propagate signal, and/or the like resulting from the inputs. Further, in some embodiments, the adder 82 is implemented to receive a pair of carry-in signals 76 carried into the carry-chain 60 (e.g., into least significant shared arithmetic logic cell 80) and/or carried in from a previous shared arithmetic logic cell 80. The adder 82 may also be implemented to receive an input resulting from a LUT 70 in the shared arithmetic logic cell 80 corresponding to the adder 82.

In some embodiments, such as during unsigned addition, each of the set of LUTs 70 of the most significant shared arithmetic logic cell 80A of the first carry-chain 60A may produce the constant zero as an output. For example, in some embodiments, instead of performing a combinatorial function on one or more inputs, the LUTs 70 may be implemented to produce constant zero. Moreover, while a LUT 70G of the second most significant shared arithmetic logic cell 80B may produce the result of a combinatorial function (denoted as 'Q') based on a set of inputs (e.g., A3 and B3), a LUT 70H of the second most significant shared arithmetic logic cell 80B may produce the constant zero as an output. As a result, the sum out signal provided by the adder 82 of the most significant shared arithmetic logic cell 80A may represent the carry-in signal 76 routed from the adder 82 of the second most significant shared arithmetic logic cell 80B summed with zero. For instance, in some embodiments, the sum out signal may remain unaffected by the output of the LUTs 70 communicatively coupled to the adder 82 and implemented to produce a constant zero (e.g., logical low). On the other hand, the sum out signal output by the adder 82 of the shared arithmetic logic cell 80B may be determined based in part on the sum of the combinatorial function 'Q' with a pair of carry-in signals 76, which may be routed from a LUT 70 and an adder 82 of a previous shared arithmetic logic cell 80 (not shown) chained into the shared arithmetic logic cell 80B.

Further, in some embodiments, such as in the second stage of a two-stage multiplier, the two least significant shared arithmetic logic cells 80 (e.g., 80C and 80D) of the second carry-chain 60B may be implemented to collectively receive four independent inputs (e.g., C1, D1, C2, D2) or fewer. For example, in the illustrated embodiment, the shared arithmetic logic cell 80D is implemented to receive four independent inputs (e.g., C1, D1, C2, D2), while the shared arithmetic logic cell 80C is implemented to receive two inputs in common with the shared arithmetic logic cell 80D (e.g., C2 and D2). Additionally, the two least significant shared arithmetic logic cells 80 (e.g., 80C and 80D) may each be implemented such that the respective the sum out signal (e.g., SUMOUT) remains unused (denoted as "Unused"), which may also occur in the second stage of a two-stage multiplier, for example. Accordingly, each of the first carry-chain 60A and the second carry-chain 60B may include unused logic and/or circuitry.

Figure 8:
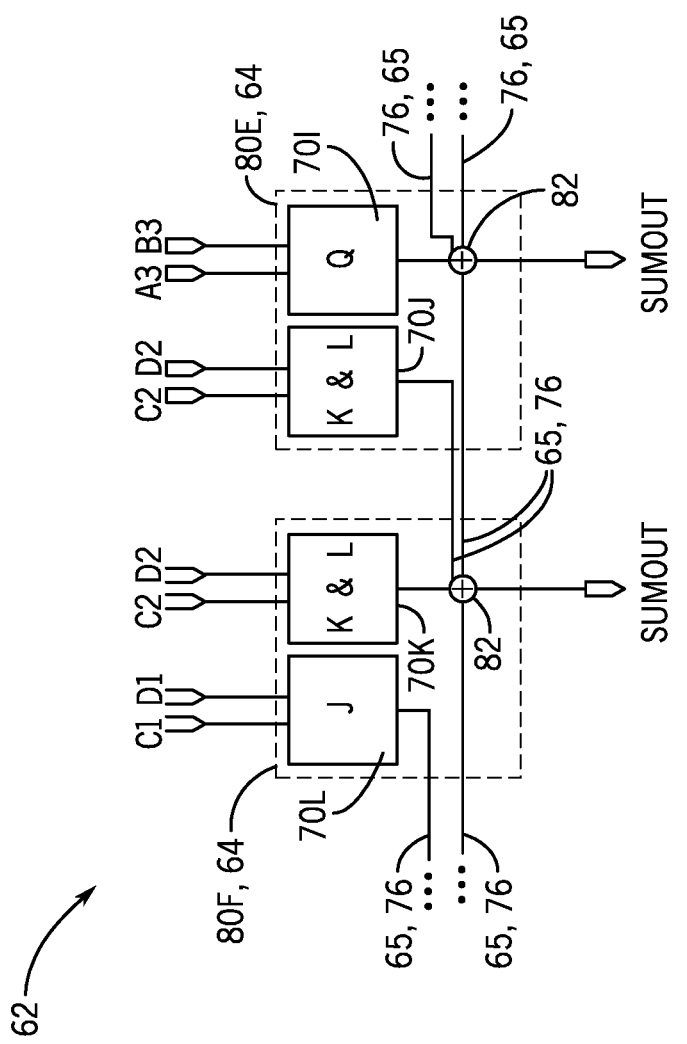
FIG. 8 is a block diagram of a pair of shared arithmetic logic cells implemented to emulate the operations of the two most and the two least significant logic cells of FIG. 7, in accordance with an embodiment.

As such, when packing the first carry-chain 60A and the second carry-chain 60B together, the circuitry and/or logic of the two most significant shared arithmetic logic cells 80 (e.g., 80A and 80B) of the first carry-chain 60A and of the two least significant shared arithmetic logic cells 80 (e.g., 80C and 80D) of the second carry-chain 60B may be consolidated into a pair of shared arithmetic logic cells 80 (e.g., 80E and 80F), as illustrated in FIG. 8. Each of the pair of shared arithmetic logic cells 80 (e.g., 80E and 80F) may include a set of LUTs 70 and an adder 82, as described above with reference to the shared arithmetic logic cells 80 (e.g., 80A, 80B, 80C, and 80D) of FIG. 7. As illustrated, a LUT 70I of the shared arithmetic logic cell 80E may determine the output of a combinatorial function 'Q' based on a set of independent inputs (e.g., A3 and B3). The output of the LUT 70I may route to an adder 82 of the shared arithmetic logic cell 80E, which may also receive two carry-in signals 76 from a previous shared arithmetic logic cell 80 of the first carry-chain 60A. Accordingly, the output of the adder 82 of the shared arithmetic logic cell 80E may match the output of the adder 82 of the shared arithmetic logic cell 80A illustrated in FIG. 7.

Moreover, the carry-out signal 65 of the adder 82 may route to a first carry-in position (e.g., input circuitry) of the adder 82 of the shared arithmetic logic cell 80F. A second carry-in position of the adder 82 of the shared arithmetic logic cell 80F may be implemented to receive an output of the LUT 70J of the shared arithmetic logic cell 80E. More specifically, in some embodiments, the LUT 70J may produce an output resulting from a combinatorial function (e.g., K&L) having the common set of inputs (e.g., C2 and D2) of FIG. 7. Additionally, the output from the LUT 70K may also route to an input of the adder 82 of the shared arithmetic logic cell 80F. To that end, the adder 82 of the shared arithmetic logic cell 80F may sum the combinatorial function 'K&L' with 'K&L' and the carry-in signal 76 resulting from the adder 82 of the shared arithmetic logic cell 80E. As a result, the sum out signal resulting from the adder 82 of the shared arithmetic logic cell 80F may match the sum out signal resulting from the adder 82 of the shared arithmetic logic cell 80A. Moreover, the carry-out signal 65 output by the adder 82 the shared arithmetic logic cell 80F may match the carry-out signal 65 output by the adder 82 of the shared arithmetic logic cell 80D.

Further, the shared arithmetic logic cell 80F may include LUT 70L, which may be implemented to determine the result of a combinatorial function (e.g., 'J') using a set of inputs (e.g., C1 and D1). Accordingly, the LUT 70D may produce the same output as the LUT 70 implemented to receive the same set of inputs (e.g., C1 and D1) in the shared arithmetic logic cell 80D. Moreover, the output of the LUT 70D may route to the carry-in position of an adder 82 in a subsequent shared arithmetic logic cell 80 of the second carry-chain 60B. As such, using reduced logic and/or circuitry, the pair of shared arithmetic logic cells 80 (e.g., 80E and 80F) may produce the same outputs as the shared arithmetic logic cells 80 of FIG. 7 (e.g., 80A, 80B, 80C, and 80D). The pair shared arithmetic logic cells 80 (e.g., 80E and 80F) may physically connect, but maintain logical separation between the first and second carry-chains (e.g., 60A and 60B, respectively). Thus, packing the first carry-chain 60A and the second carry-chain together using the pair of shared arithmetic logic cells 80 (e.g., 80E and 80F) may increase the available area on the integrated circuit device 12. For instance, as described above, a packed carry-chain 60 having two fewer shared arithmetic logic cells 80 than the total number of shared arithmetic logic cells 80 in the first carry-chain 60A and the second carry-chain 60B may be formed using the pair of shared arithmetic logic cells 80 (e.g., 80E and 80F) in place of the two most significant shared arithmetic logic cells 80 (e.g., 80A and 80B) of the first carry-chain 60A and the two least significant shared arithmetic logic cells 80 (e.g., 80C and 80D) of the second carry-chain 60B.

Figure 9:
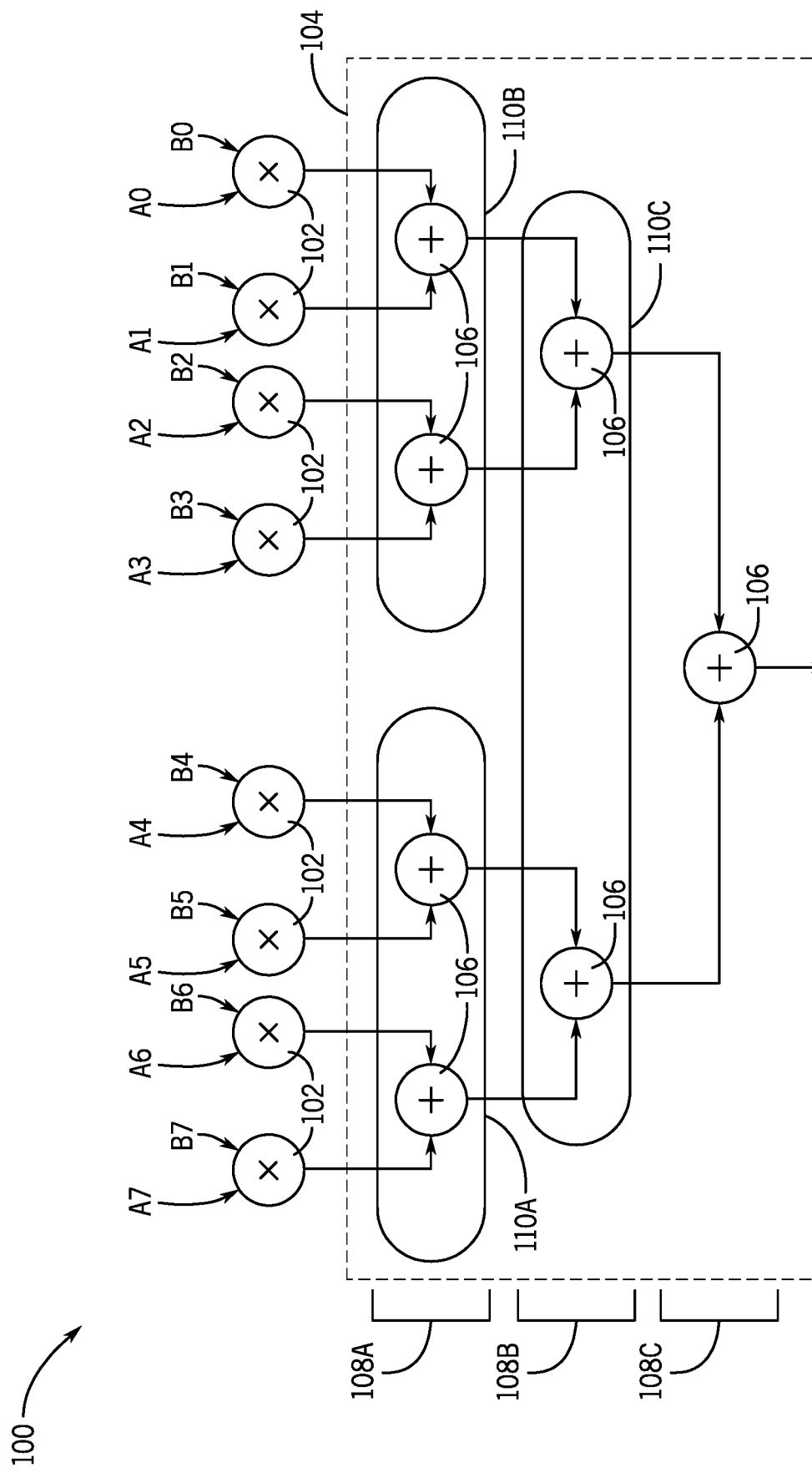
FIG. 9 is a block diagram of a dot-product structure including an adder tree, in accordance with an embodiment.

Turning now to FIG. 9, an embodiment of a dot-product structure 100, such as dot-product circuitry 26, is illustrated. The dot-product structure 100 may include a set of multipliers 102 and an adder tree 104 implemented to determine the total sum of the products produced by the set of multipliers 102. More specifically, the adder tree 104 includes a set of signed adders 106 each implemented to determine a signed addition of a respective set of inputs. It may be appreciated the illustrated signed adders 106 may be implemented using, for example, a carry-chain 60. Further, in some embodiments, the adder tree 104 may be structured with stages of adders 108 (e.g., 108A, 108B, 108C). Each adder 106 in a first stage of adders 108A may determine a respective first sum of a respective set of products. Further, each adder 106 in a second stage of adders 108B may determine a respective second sum of a respective set of first sums routed from the first stage of adders 108. A final stage of adders 108C may sum each of the second sums resulting from the second stage of adders 108B. Moreover, to pack the adder tree 104 onto the integrated circuit device 12, pairs of signed adders 110 (e.g., 110A, 110B, 110C) may be packed together. Because a signed adder 106 may generate a non-zero carry-out value, a dummy arithmetic cell 66 may be packed between a pair of signed adders 110, which as discussed above, may consume area of the integrated circuit device 12.

Figure 10:
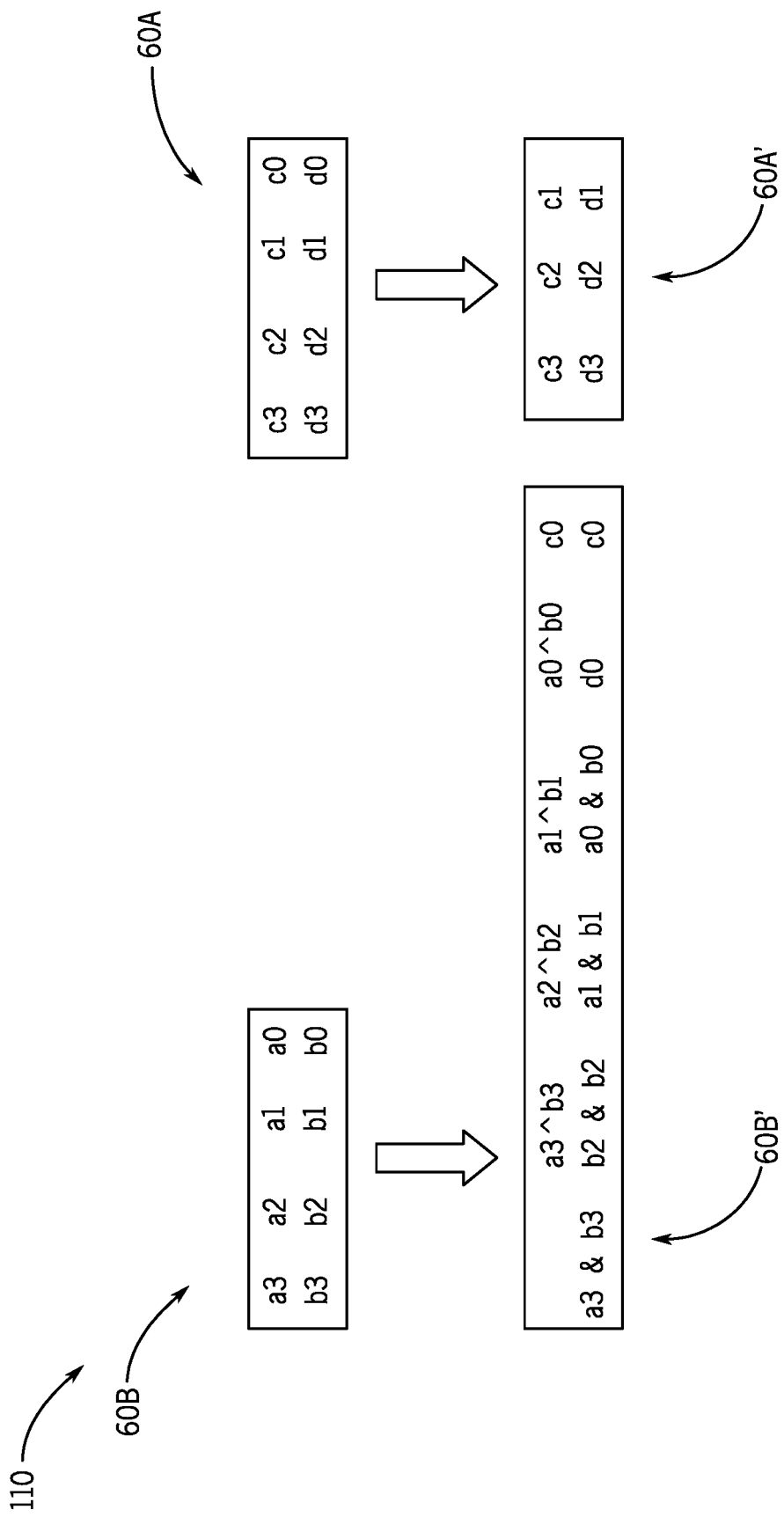
FIG. 10 is a is a block diagram of the redistribution of input bits between a first and second carry-chain corresponding to a pair of adders in the adder tree of FIG. 9, in accordance with an embodiment.

In some embodiments, because the outputs of a pair of signed adders 110 will be summed in a subsequent stage 108 of the adder tree 104 and because the inputs to each of the pair of signed adders 110 may be less than a maximum possible value the each of the signed adders 108 are implemented to receive (e.g., because each input originates from a multiplier 102), the inputs between a pair of signed adders 110 may be redistributed to pack the pair of signed adders 110 without a dummy arithmetic cell 66. As an illustrative example, FIG. 10 demonstrates a first carry-chain 60A, which may represent a first signed adder 106 in a pair of signed adders 110. As illustrated, the first carry-chain 60A is implemented to sum two, four-bit inputs (e.g., C0, C1, C2, C3 and D0, D1, D2, D3). A second carry-chain 60B, which may represent a second signed adder 106 in the pair of signed adders 110, may be implemented to sum two, four-bit inputs (e.g., A0, A1, A2, A3 and B0, B1, B2, B3). By redistributing the two least significant input bits (e.g., C0 and D0) of the first carry-chain 60A to the second carry-chain 60B, a restructured first carry-chain 60A' implemented to sum two, three-bit inputs (e.g., C1, C2, C3 and D1, D2, D3) and a restructured second carry-chain 60B' implemented to sum two, five-bit inputs may be formed. As illustrated, in some embodiments, to accommodate the additional input bits (e.g., C0 and D0), the restructured second carry-chain 60B' may apply half-adder transformations to the inputs. For example, for each corresponding pair of original inputs to the second carry-chain 60B (e.g., A0 and B0, A1 and B1, A2 and B2, A3 and B3), the restructured carry-chain 60B' may determine the exclusive OR (XOR) and the logical AND of the pair of inputs. It may be appreciated that any suitable transformations, such as redundant form arithmetic and/or 3:2 compression, may additionally or alternatively be implemented in the restructured second carry-chain 60B'. Thus, embodiments are intended to be illustrative and not limiting.

Figure 11:
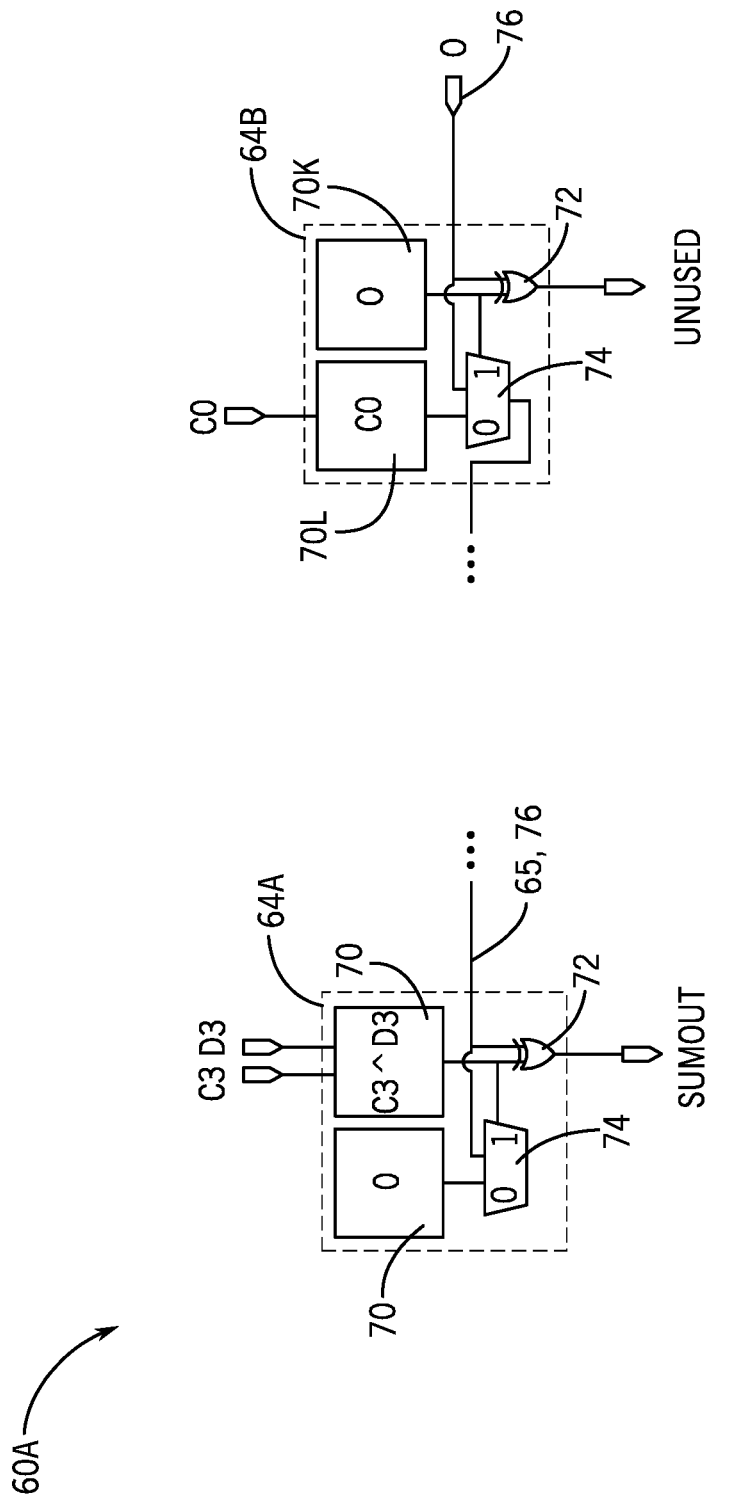
FIG. 11 is a block diagram of the most and least significant logic cell of the first carry-chain of FIG. 10, in accordance with an embodiment.

Further, as discussed in greater detail below, while the total number of input bits, which may correspond to the total number of logic cells 64, may remain the same between the first and second carry-chain (e.g., 60A and 60B) and the restructured first and second carry-chain (e.g., 60A' and 60B'), the restructured first and second carry-chain 60A' and 60B', respectively may pack together more efficiently into a packed carry-chain 62. As an illustrative example, FIG. 11 details an embodiment of the most significant logic cell 64A and the least significant logic cell 64B of the first carry-chain 60A. In some embodiments, the least significant logic cell 64B of the first-carry chain 60A may be implemented to receive the least significant input one or more bits (e.g., C0)

of the first carry-chain 60A. Accordingly, the logic of the least significant logic cell 64A may be suitable for redistribution in a packed carry-chain 62, as described in greater detail below. Further, while the illustrated LUT 70 of the most significant logic cell 64A is implemented to determine the combinatorial function C3 XOR D3 (e.g., C3^D3), it may be appreciated that the least significant logic cell 64B may be implemented to determine any suitable combinatorial function, as described above.

Figure 12:
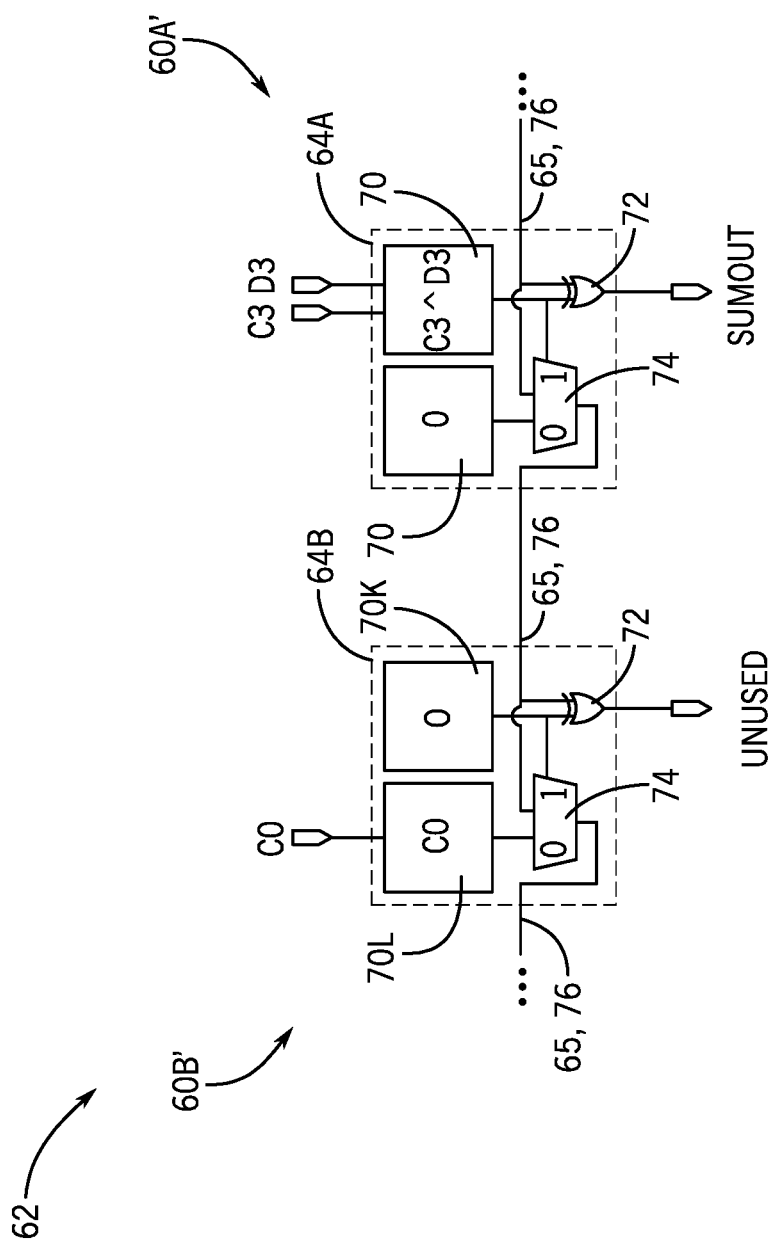
FIG. 12 is a block diagram of the redistribution of the most and least significant logic cell of FIG. 11 in a packed carry-chain, in accordance with an embodiment.

Turning now to FIG. 12, by redistributing the inputs to the first and second carry-chains 60 (e.g., 60A and 60B, respectively) the restructured first carry-chain 60A' and the restructured second carry-chain 60B' may be packed into, for example, the illustrated packed carry-chain 62. More specifically, in some embodiments, the packed carry-chain 62 may be implemented such that the restructured first carry-chain 60A' and the restructured carry-chain 60B' may be packed together without the use of a dummy arithmetic cell 66. For example, the least significant logic cell 64B of the first carry-chain 60A may be relocated to become the least significant logic cell 64B of the restructured second carry-chain 60B'. Further, the most significant logic cell 64A of the restructured first carry-chain 60A' may be operatively coupled directly to the least significant logic cell 64B of the restructured second carry chain 60B'. For instance, the carry-out signal 65 of the most significant logic cell 64A of the restructured first carry-chain 60A' may be routed as the carry-in signal 76 to the least significant logic cell 64B of the restructured second carry-chain 60B'. Accordingly, because the mux 74 of the least significant logic cell 64B is implemented to select an output regardless of the value of the carry-in signal 76, the carry-out signal 65 routed into the least significant logic cell 64B may not modify the output of the restructured second carry-chain 60B. In the illustrated embodiment, for example, the mux 74 of the least significant logic cell 64B is implemented to output the value corresponding to a select signal of zero (e.g., logical low) routed from a LUT 70K of the least significant logic cell 64B. Accordingly, because the output (e.g., C0) of the LUT 70L is routed to the mux input corresponding to the select signal of zero, the mux 74 may select the output of the LUT 70L regardless of the carry-in signal 76. To that end, the packed carry-chain may be implemented without a dummy arithmetic cell 66. Moreover, while the carry-out signal 65 may carry into a subsequent logic cell 64 of the restructured second carry-chain 60B', because the outputs of the restructured first carry-chain 60A' and the restructured second carry-chain may be summed in a subsequent adder stage 108, this transformation (e.g., redistribution of input bits) may not impact the sum produced by the subsequent adder stage 108 and/or the adder tree 104. As such, the packed carry-chain 62 may be implemented with reduced logic and/or circuitry compared to a packed carry-chain 62 implemented with a dummy arithmetic cell 66. Accordingly, the illustrated packed carry-chain 62 may consume less area on the integrated circuit device 12.

Figure 13:
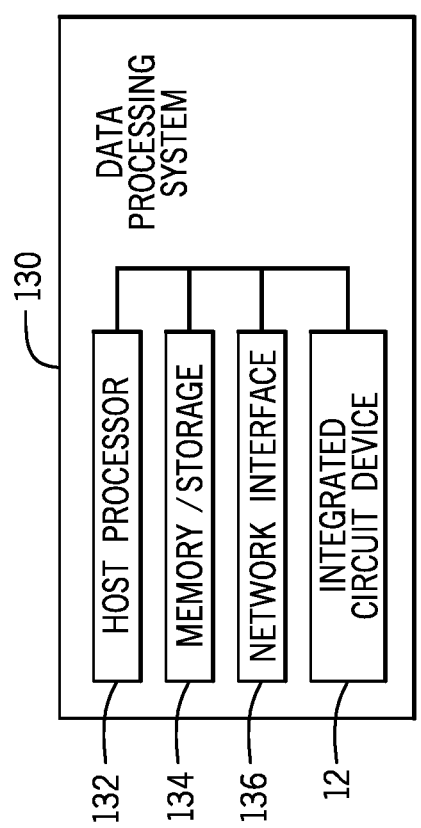
FIG. 13 is a block diagram of a data processing system, in accordance with an embodiment.

The integrated circuit device 12 may be, or may be a component of, a data processing system. For example, the integrated circuit device 12 may be a component of a data processing system 130, shown in FIG. 13. The data processing system 130 may include a host processor 132, memory and/or storage circuitry 134, and a network interface 136. The data processing system 130 may include more or fewer components (e.g., electronic display, user interface structures, application specific integrated circuits (ASICs)). The host processor 132 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 130 (e.g., to perform machine learning, video processing, voice recognition, image recognition, data compression, database search ranking, bioinformatics, network security pattern identification, spatial navigation, or the like). The memory and/or storage circuitry 134 may include random access memory (RAM), read-only memory (ROM), one or more hard drives, flash memory, or the like. The memory and/or storage circuitry 134 may hold data to be processed by the data processing system 130. In some cases, the memory and/or storage circuitry 134 may also store configuration programs (bitstreams) for programming the integrated circuit device 12. The network interface 136 may allow the data processing system 130 to communicate with other electronic devices. The data processing system 130 may include several different packages or may be contained within a single package on a single package substrate.

In one example, the data processing system 130 may be part of a data center that processes a variety of different requests. For instance, the data processing system 130 may receive a data processing request via the network interface 136 to perform machine learning, video processing, voice recognition, image recognition, data compression, database search ranking, bioinformatics, network security pattern identification, spatial navigation, or some other specialized task. The host processor 132 may cause the programmable logic fabric of the integrated circuit device 12 to be programmed with dot product circuitry, for example, suitable to implement a requested task. For instance, the host processor 132 may instruct that a configuration data (bitstream) stored on the memory and/or storage circuitry 134 to be programmed into the programmable logic fabric of the integrated circuit device 12. The configuration data (bitstream) may represent a circuit design for dot product circuitry including a set of one or more carry-chains, which may be mapped to and packed together in the programmable logic according to the techniques described herein. By efficiently mapping and packing the carry-chains, which may be implemented to compute a portion of a dot-product, for example, the area and/or routing resources used to perform the requested task may be reduced on the integrated circuit device 12. Moreover, the placement and routing time, as well as the timing closure of the carry-chains may be improved compared to traditional carry-chain mapping and/or packing techniques.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. For example, while the techniques described herein relating to the redistribution of inputs in signed addition operations relate to the illustrated adder tree 104 of FIG. 9, the techniques may additionally or alternatively be applied to alternative signed adder structures. Accordingly, the disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. Packed carry-chain circuitry on an integrated circuit device, the packed carry-chain circuitry comprising:
  first carry-chain circuitry, wherein the first carry-chain circuitry comprises a first number of logic cells each implemented to perform a respective first arithmetic operation; and
  second carry-chain circuitry, wherein the second carry-chain circuitry comprises a second number of logic cells each implemented to perform a respective second arithmetic operation independently from the first arithmetic operations of the first carry-chain circuitry;
  wherein the packed carry-chain circuitry is configured to perform the respective first arithmetic operation and the second arithmetic operation; and
  wherein at least one logic cell of the first number of logic cells is used by the first number of logic cells to perform the respective first arithmetic operation and is included in the second number of logic cells, wherein the at least one logic cell is configured to physically couple the first carry-chain circuitry to the second carry-chain circuitry, and wherein the at least one logic cell is configured to maintain logical separation between the first carry-chain circuitry and the second carry-chain circuitry without a dummy arithmetic cell between the first carry-chain circuitry and the second carry-chain circuitry.

2. The packed carry-chain circuitry of claim 1, wherein a first logic cell of the first number of logic cells comprises a set of look up tables (LUTs).

3. The packed carry-chain circuitry of claim 2, wherein the set of LUTs is configured to determine a result of a combinatorial function based at least in part on an input received at the first logic cell.

4. The packed carry-chain circuitry of claim 3, wherein the combinatorial function comprises one or more of an exclusive OR function or a logical AND function.

5. The packed carry-chain circuitry of claim 2, wherein the first logic cell of the first number of logic cells comprises a multiplexor (mux) communicatively coupled to each of the set of LUTs.

6. The packed carry-chain circuitry of claim 1, wherein the at least one logic cell comprises a most significant logic cell of the first carry-chain circuitry and wherein the at least one logic cell comprises a least significant logic cell of the second carry-chain circuitry.

7. The packed carry-chain circuitry of claim 6, wherein the most significant logic cell of the first carry-chain comprises unused carry-out circuitry, and wherein the least significant logic cell of the second carry-chain comprises unused output circuitry.

8. The packed carry-chain circuitry of claim 1, wherein the at least one logic cell comprises a pair of shared arithmetic logic cells, wherein the pair of shared arithmetic logic cells comprise two most significant logic cells of the first carry-chain circuitry and two least significant logic cells of the second carry-chain.

9. The packed carry-chain circuitry of claim 8, wherein the two most significant logic cells of the first carry-chain circuitry comprise unused carry-out circuitry, and wherein the least significant logic cells of the second carry-chain comprise unused output circuitry.

10. The packed carry-chain circuitry of claim 8, wherein a shared arithmetic logic cell of the pair of shared arithmetic logic cells comprises first carry-in circuitry and second carry-in circuitry.

11. The packed carry-chain circuitry of claim 10, wherein the shared arithmetic logic cell comprises adder circuitry communicatively coupled to the first carry-in circuitry and second carry-in circuitry.

12. The packed carry-chain circuitry of claim 1, wherein dot-product circuitry implemented on the integrated circuit device comprises the first carry-chain circuitry.

13. The packed carry-chain circuitry of claim 1, wherein the integrated circuit device comprises a field-programmable gate array.

14. A method for generating packed carry-chain circuitry on an integrated circuit device, comprising:
  identifying first carry-chain circuitry configurable to fit into the packed carry-chain circuitry, wherein the first carry-chain circuitry is configured to perform a first arithmetic operation, and wherein the first carry-chain circuitry comprises first arithmetic logic circuitry and a first number of logic cells each implemented to perform a respective first arithmetic operation;
  identifying second carry-chain circuitry configurable to fit into the packed carry-chain circuitry, wherein the second carry-chain circuitry is configured to perform a second arithmetic operation, wherein the second arithmetic operation is independent from the first arithmetic operation, and wherein the second carry-chain comprises second arithmetic logic circuitry and a second number of logic cells each implemented to perform a respective second arithmetic operation; and
  configuring at least one logic cell of the first number of logic cells used by the first number of logic cells to perform the respective first arithmetic operation to be included in the second number of logic cells, wherein the packed carry-chain circuitry is configured to perform the respective first arithmetic operation and the second arithmetic operation, wherein the at least one logic cell is configured to physically couple the first carry-chain circuitry to the second carry-chain circuitry, and wherein the at least one logic cell is configured to maintain logical separation between the first carry-chain circuitry and the second carry-chain without a dummy arithmetic cell between the first carry-chain circuitry and the second carry-chain circuitry.

15. The method of claim 14, wherein the first arithmetic logic circuitry is configured to determine a result of a signed addition operation.

16. The method of claim 15, wherein the first arithmetic logic circuitry comprises input circuitry, wherein the first arithmetic logic circuitry is configured to perform the first arithmetic operation based at least in part on a value received at the input circuitry, wherein the second arithmetic logic circuitry is configured to perform the second arithmetic operation independently from the value, and the method further comprising configuring the first carry-chain circuitry and the second carry-chain circuitry in the packed carry-chain circuitry by:
  configuring the packed carry-chain circuitry to perform the first arithmetic operation independently from the value; and
  configuring the packed carry-chain circuitry to perform the second arithmetic operation based at least in part on the value.

17. The method of claim 14, comprising:
- determining that the first arithmetic logic circuitry comprises unused carry-out circuitry; and
- determining that the second arithmetic logic circuitry comprises unused output circuitry.

18. The method of claim 14, wherein the packed carry-chain circuitry comprises a third number of arithmetic logic cells, and wherein the third number of arithmetic logic cells is less than a total number of logic cells included in the first number of logic cells and the second number of logic cells.

19. A tangible, non-transitory, machine-readable medium, comprising machine-readable instructions to construct packed carry-chain circuitry on an integrated circuit device that, when executed by one or more processors, cause the processors to:
- identify first carry-chain circuitry configurable to fit into the packed carry-chain circuitry, wherein the first carry-chain circuitry is configured to perform a first arithmetic operation, and wherein the first carry-chain comprises first logic circuitry and a first number of logic cells each implemented to perform a respective first arithmetic operation;
- identify second carry-chain circuitry configurable to fit into the packed carry-chain circuitry, wherein the second carry-chain circuitry is configured to perform a second arithmetic operation, wherein the second arithmetic operation is independent from the first arithmetic operation, and wherein the second carry-chain comprises second logic circuitry and a second number of logic cells each implemented to perform a respective second arithmetic operation; and
- configure at least one logic cell of the first number of logic cells used by the first number of logic cells to perform the respective first arithmetic operation to be included in the second number of logic cells, wherein the packed carry-chain circuitry is configured to perform the respective first arithmetic operation and the second arithmetic operation, wherein the at least one logic cell is configured to physically couple the first carry-chain circuitry to the second carry-chain circuitry, and wherein the at least one logic cell is configured to maintain logical separation between the first carry-chain circuitry and the second carry-chain without a dummy arithmetic cell between the first carry-chain circuitry and the second carry-chain circuitry.

20. The tangible, non-transitory, machine-readable medium of claim 19, wherein the machine-readable instructions, when executed by one or more processors, cause the processors to:
- configure two-stage multiplier circuitry, wherein configuring the two-stage multiplier circuitry comprises configuring a stage of the two-stage multiplier circuitry using the packed carry-chain circuitry.

* * * * *